United States Patent
Aoki

(10) Patent No.: US 7,760,782 B2
(45) Date of Patent: Jul. 20, 2010

(54) DISTRIBUTED BRAGG REFLECTOR TYPE DIRECTLY MODULATED LASER AND DISTRIBUTED FEED BACK TYPE DIRECTLY MODULATED LASER

(75) Inventor: Masahiro Aoki, Yokohama (JP)

(73) Assignee: Opnext Japan, Inc., Yokohama-shi (JP)

( * ) Notice: Subject to any disclaimer, the term of this patent is extended or adjusted under 35 U.S.C. 154(b) by 0 days.

(21) Appl. No.: 11/473,011

(22) Filed: Jun. 23, 2006

(65) Prior Publication Data

US 2006/0291516 A1 Dec. 28, 2006

(30) Foreign Application Priority Data

Jun. 24, 2005 (JP) ............................. 2005-184588

(51) Int. Cl.
*H01S 5/00* (2006.01)
(52) U.S. Cl. .................. 372/44.01; 372/18; 372/26; 372/50.11; 372/99; 372/102
(58) Field of Classification Search .............. 372/26, 372/50.11, 96, 18, 44.01, 99, 102
See application file for complete search history.

(56) References Cited

U.S. PATENT DOCUMENTS

| | | | | |
|---|---|---|---|---|
| 4,815,090 | A * | 3/1989 | Usami et al. | 372/50.11 |
| 5,349,598 | A * | 9/1994 | Ouchi et al. | 372/50.21 |
| 6,693,936 | B2 * | 2/2004 | Kitaoka et al. | 372/50.11 |
| 2003/0133482 | A1 * | 7/2003 | Yoshida et al. | 372/43 |

FOREIGN PATENT DOCUMENTS

| | | |
|---|---|---|
| JP | 2003-046190 | 2/2003 |
| JP | 2003-289169 | 10/2003 |
| JP | 2004-235182 | 8/2004 |

OTHER PUBLICATIONS

H. Roscher et al., Lowe thermal Resistance Flip-Chip Bonding of 850nm 2-D VCSEL Arrays Capable of 10 Gbit/s/ch Operation, Laser's and Electro-optics Society, 2003. LEOS 2003, The 16th Annual Meeting of the IEEE vol. 2, Oct. 27-28, 2003 pp. 511-512 vol. 2.

(Continued)

*Primary Examiner*—Minsun Harvey
*Assistant Examiner*—Yuanda Zhang
(74) *Attorney, Agent, or Firm*—Antonelli, Terry, Stout & Kraus, LLP.

(57) ABSTRACT

The invention aims at realizing a 1300-nm-band direct modulation laser, having a single lateral mode, in which a chip light power of several milliwatts and a low current operation are simultaneously realized. Also, the invention aims at realizing a laser light source excellent in economy as well by realizing output characteristics of a vertical cavity surface light emitting laser. A distributed Bragg reflector laser is constructed in the form of a semiconductor laser having a multilayer structure formed on a predetermined semiconductor substrate. The multilayer structure includes an active region for emitting a laser beam, and a distributed Bragg reflector layer. A length of the active region falls within the range of 10 to 100 μm, and a laser light beam is generated in accordance with ON/OFF of current injection to the active region.

17 Claims, 11 Drawing Sheets

OTHER PUBLICATIONS

K. Nakahara et al., 115 C, 12.5-Gb/s direct modulation of 1.3-μm InGaAlAs-MQW RWG DFB laser with notch-free grating structure for datacom applications, Optical Fiber Communications Conference, 2003. OFC 2003, Mar. 3-28, 2003 pp. PD40—P1-3 vol. 3.

H. Arimotoet al., wide-Wavelength-Range and High-Output-Power Short-Cavity DBR Laser Array with Active Distributed Bragg Reflector, IEEE 19th International Semiconductor Laser Conference Digest, p. 141.

N. Nishiyama et al., Temperature, Modulation and Reliability Characteristics of 1.3 μm-VCSELs on InP with AlGaInAs/InP Lattice Matched DBR, IEEE 19th International Semiconductor Laser Conference Digest, p. 115.

N. Fujiwara et al., Mode-hop-free tuning enchamced by self-phase-adjustment in a short-active-region DBR laser, IEEE 19th International Semiconductor laser Conference Digest p. 143.

K. Janiak et al., Bottom Emitting 1.3 μm BH-FP Laser with Integrated 45 Reflector and Monitor Photodiode, IEEE 18th International Semiconductor Laser Conference Digest, 113.

A. Behfar et al., Monolithically Integrated Diplexer Chip for PON Applications, Optical Fiber Communications Conference, 2005, OFC 2005, Mar. 6-11, 2005 OtuM5.

* cited by examiner

DER=6.2dB

DER=6.4dB

DER=6.8dB

DISTRIBUTED BRAGG REFLECTOR TYPE DIRECTLY MODULATED LASER AND DISTRIBUTED FEED BACK TYPE DIRECTLY MODULATED LASER

CLAIM OF PRIORITY

The present application claims priority from Japanese application JP 2005-184588 filed on Jun. 24, 2005 the content of which is hereby incorporated by reference into this application.

FIELD OF THE INVENTION

The present invention relates to optical semiconductor devices and optical modules using those, and more particularly to optical semiconductor light emitting/receiving devices which are less in electric power and which are suitable for being used in optical communication and the like, and modules using those.

BACKGROUND OF THE INVENTION

Along with the abrupt development of the information technology, technology with which large capacity promotion, increase in port mounting density, and economical efficiency of a system are made compatible with one another has become more and more important not only in the conventional communication network (telecom), but also in the datacom such as a storage area network (SAN) or the Ethernet (registered trademark) (LAN) which has remarkably progressed. The throughput of these high-speed interface systems is limited by the mounting density depending on the module size and the power consumption in addition to the speed per channel port. From this, the miniaturization and power saving promotion of the optical components serving as main components have become a key for determining the total performance of the device.

For this reason, in the semiconductor laser, the semiconductor photo detector and its module which control transmission/reception of an optical signal, how the power consumption is reduced has become an important index.

FIG. 1 is a graphical representation in which transmission light sources used in transmission/reception light source modules each of which operates at 10 gigabits per second are classified with respect to power consumption and a fiber transmission distance. As can be seen from the figure, the fiber transmission distance and the module power consumption show a trade-off relationship. This is because the semiconductor light beams and electronic devices thus used are different from one another with respect to the distance as shown in the figure. In general, a direct modulation system in which a wavelength of a signal light beam is equal to or shorter than about 1.3 μm or about 0.85 μm is used in short distance applications. Making further classification, in ultra-short distance transmission having a distance of several hundreds meters or less, a 0.85-μm-band multimode vertical cavity surface emitting laser (VCSEL) is used as a light source for direct modulation. This multimode vertical cavity surface emitting laser is disclosed in non-patent document 1: Lasers and Electro-optics Society, 2003. LEOS 2003, The 16th Annual Meeting of the IEEE Volume 2, 27-28 Oct. 2003 Page(s): 511-512 vol. 2. On the other hand, in applications for a short distance of about 10 km or less, a 1.3-μm-band single mode edge emitting laser is used as a light source for direct modulation. This 1.3-μm-band single mode edge emitting laser is disclosed in non-patent document 2: Optical Fiber Communications Conference, 2003. OFC 2003, 3-28 Mar. 2003 Page(s): PD40—P 1-3 vol. 3.

In the direct modulation system, the power consumption is little since the module can be realized with a relatively simple construction. In particular, the vertical cavity surface emitting laser operates with a little current of about several milli-amperes to about 10 mA because a micro cavity structure having a sub-micron length is reflected therein. Thus, the vertical cavity surface emitting laser has a laser cavity structure which is very little in power consumption and which has essentially an excellent power saving property. In addition, all the laser cavity structures can be manufactured only in the wafer process, and the inspection and selection process thereof can be carried out in a wafer state. Thus, the vertical cavity surface emitting laser has the excellent feature in terms of the economical efficiency as well.

On the other hand, in order that a 1.3-μm-band edge emitting laser may operate at 10 gigabits per second, it is actually required that the 1.3-μm-band edge emitting laser operates with a current of about 60 mA or more at minimum. For this reason, the power consumption rises extremely up to about double. Thus, for the purpose of applying the vertical cavity surface emitting laser to the applications for a short distance of about 10 km or less, the 1.3-μm-band vertical cavity surface emitting laser is being energetically investigated. However, in the present circumstances, it is difficult for chip light power of a several milliwatt class becoming a key for the practical application to technically realize with a single lateral mode structure. This is because of a luminous layer with a too small volume. As described in non-patent document 3: IEEE 19th International Semiconductor Laser Conference Digest, p. 141, in the case of the 1.3-μm-band vertical cavity surface emitting laser, light power abruptly drops to about several hundreds milliwatts at high temperatures with a luminous area diameter of about 5 μm or less as a simple mode condition. The light power of about 1 mW is obtained when the luminous area diameter is equal to or larger than about 10 μm. However, in this case, the 1.3-μm-band vertical cavity surface emitting laser is forced to operate with a multi-mode.

On the other hand, in the applications for a middle/long distance of about 40 km or more, there is adopted an external modulation system using an optical modulator which operates in a 1.55-μm-band permitting the less transmission loss of the optical fiber. As a result, the power consumption further increases. In addition thereto, in a wavelength division multiplexing (WDM) system transmission, a newly consumed power is added for wavelength stabilization of a wavelength variable light source. Thus, in the present circumstances, an electronic power is compelled to increase several times or more as much as that in the ultra-short distance transmission.

At that, as for known examples each relating to the laser cavity structure of the present invention, there are techniques disclosed in non-patent document 4: IEEE 19th International Semiconductor Laser Conference Digest, p. 115, and in non-patent document 5: IEEE 19th International Semiconductor Laser Conference Digest, p. 143. Each of these techniques relates to an improvement in wavelength variable characteristics of a 1.55-μm-band wavelength variable laser light source. While the operation principles of each of them are different from those of a high-speed direct modulation light source of the present invention, since each of them has a similar device structure, non-patent documents 4 and 5 are described herein with non-patent documents 1, 2 and 3. In addition, as for known examples each relating to the vertical cavity surface emitting laser structure of the present invention, there are techniques disclosed in non-patent document 6: IEEE 18th International Semiconductor Laser Conference Digest, p. 113, and in non-patent document 7: Optical Fiber Communications Conference, 2005, OFC 2005, 6-11 Mar. 2005 OTuM5.

SUMMARY OF THE INVENTION

In the light of the foregoing, it is an object of the present invention to realize a direct modulation laser, having a single lateral mode, in which a chip light power of several milliwatts, and a low current operation as a key of a power saving operation are simultaneously realized. In particular, it is important to realize a 1.3-μm-band direct modulation laser which is suitable for a short-distance application in which an optical fiber transmission distance is equal to or shorter than about 10 km.

It is another object of the present invention to realize a laser light source which is excellent in economical efficiency as well by realizing output characteristics of a vertical cavity surface emitting laser.

It is still another object of the present invention to realize an optical communication module having a less power consumption based on a suitable mounting technique for these lasers.

It has been found out from a viewpoint of a low operating current that a cavity length of a laser permitting an operating current to be minimized while a high-speed property of the laser is maintained falls within the range of several tens micrometers. Firstly, the principles thereof will hereinafter be described in detail.

The high speed property of a semiconductor laser is limited by factors relating to laser light emission and to parasitic capacity. In the case of the operating speed up to about 40 gigabits per second, the latter factor relating to the parasitic capacity is not a problem if the currently newest laser manufacturing technique is used. Thus, the former factor relating to the laser light emission is an essential problem. In this case, a parameter as an index for the high-speed property is a relaxation oscillation frequency ($f_r$) which is expressed by Expression (1)

$$f_r \propto \sqrt{\frac{dg}{dN} \frac{\alpha_i + \alpha_m}{\alpha_m} \frac{1}{L_c} I_m} \quad (1)$$

where dg/dN is a differential gain, $\alpha_i$ is an internal loss, $\alpha_m$ is a mirror loss, $L_c$ is a laser cavity length, and $I_m$ is a modulation current.

In order to perform the modulation at a high speed, it is essentially necessary for the relaxation oscillation frequency $f_r$ to have a large value. Therefore, $\eta_{fr}$ is defined as an index permitting the modulation to be performed at a high speed with a current as little as possible by Expression (2):

$$\eta_{fr} = \frac{f_r}{\sqrt{I_m}} \propto \sqrt{\frac{dg}{dN} \frac{\alpha_i + \alpha_m}{\alpha_m} \frac{1}{L_c}} \quad (2)$$

Since the index $\eta_{fr}$ is inversely proportional to the square root of the laser cavity length $L_c$, the large $\eta_{fr}$ is easy to obtain with a short cavity structure having the small $L_c$. For this reason, in the case of the edge emitting laser which operates at a rate of about 10 gigabits per second, the laser cavity length $L_c$ has been set to a value of about 200 to about 250 μm as the shortest value with which the edge emitting laser has could been manufactured by utilizing the cleavage method. However, in the present circumstances, it is difficult to shorten the laser cavity length any more by utilizing the current laser manufacturing technique.

On the other hand, since the vertical cavity surface emitting laser has the micro-cavity structure in which the cavity length $L_c$ is on the order of micrometers, the relaxation oscillation frequency $f_r$ is seemingly expected to have a large value. However, actually, this $f_r$ value is equal to or smaller than that of the above-mentioned edge emitting laser at the most. This is because it becomes impossible to disregard the dependency of the differential gain dg/dN, the internal loss $\alpha_i$, and the mirror loss $\alpha_m$ on the cavity length $L_c$. In particular, reduction of the active layer volume resulting from the shortening of the laser cavity increases a threshold carrier density and thus causes gain saturation in the luminous layer. From this, it is understood that the optimal cavity length $L_c$ exists which gives the laser device the maximum $\eta_{fr}$.

FIG. 2 is a graphical representation showing examples of calculation of the dependency of the maximum relaxation oscillation frequency $f_r$ on the cavity length $L_c$ when an upper limit value of a driving current is set. For example, for the upper limit values of the driving current from about 20 to about 80 mA, the respective optimal values for the cavity length $L_c$ fall within the range of about 10 to about 100 μm.

Each of the optimal values for the cavity length $L_c$ is one that cannot be realized by utilizing the conventional cleavage method, and corresponds to a region that cannot be realized even in the vertical cavity surface emitting laser.

The present invention proposes a short cavity distributed Bragg reflector (DBR type) laser having a new laser structure with which the above-mentioned optimal cavity structure is realized on the basis of the above-mentioned principles. In addition, in order to realize the economical efficiency of the vertical cavity surface emitting laser as well, respective monolithic reflecting mirrors which are manufactured during a semiconductor wafer process are provided before and after the laser active layer. Also, the angled mirror structure for changing the direction of emission of the light power to the upper or lower surface of the substrate is introduced into the laser emission end face. As a result, the single mode characteristics, the light power of several milliwatts, and the vertical cavity surface emitting characteristics which have could not been conventionally realized can be simultaneously realized not only in the distributed Bragg reflector (DBR type) laser, but also in the distributed feedback (DFB type) laser.

According to the present invention, it is possible to realize the direct modulation laser, having the single lateral mode, in which the chip light power of several milliwatts and the low current operation as a key for the power saving operation are simultaneously realized. In particular, it is possible to realize the 1.3-μm-band light source which is suitable for the short distance application in which the optical fiber transmission distance is equal to or shorter than about 10 km. Moreover, since the vertical cavity surface emitting laser output can be realized, it becomes possible to manufacture the laser light source which is excellent in economical efficiency as well. In addition, mounting suitably these lasers makes it possible to realize the optical communication module which is excellent in heat radiation property and which is less in power consumption.

DESCRIPTION OF THE PREFERRED EMBODIMENTS

Preferred embodiments of the present invention will hereinafter be described in detail with reference to FIGS. 3 to 11.

Figure 1:
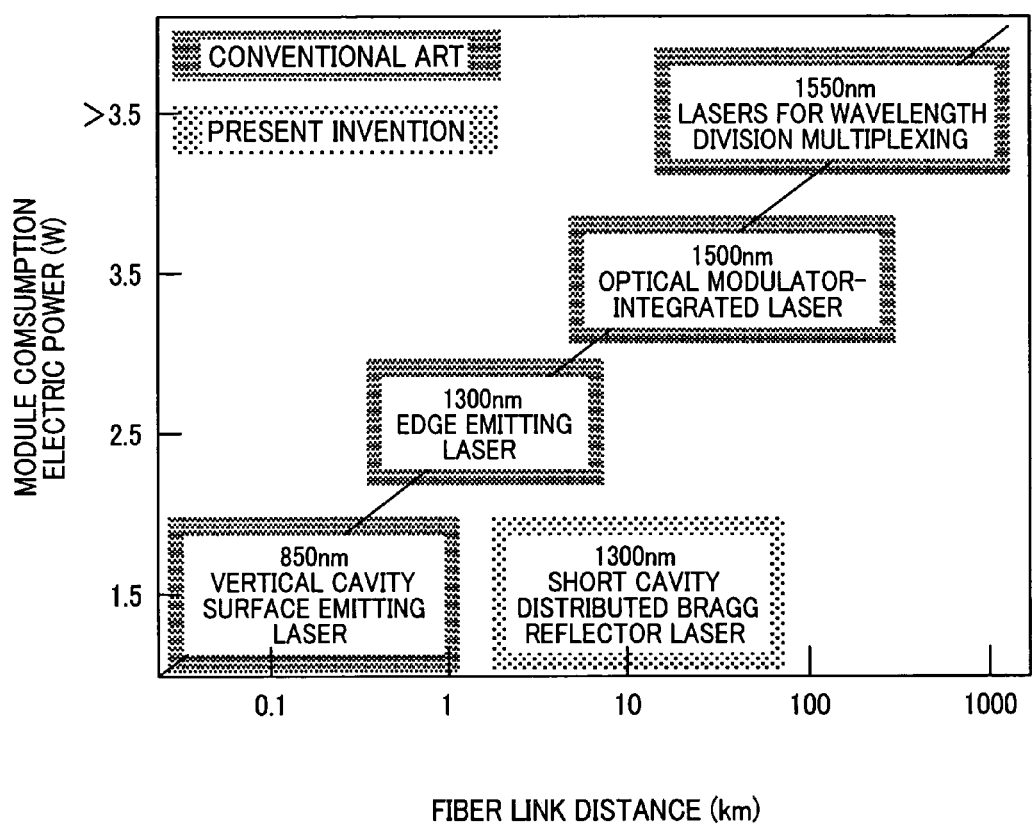
FIG. 1 is a graphical representation showing the relationship between power consumption of a transmission/reception light source module, and a fiber transmission distance.
Figure 2:
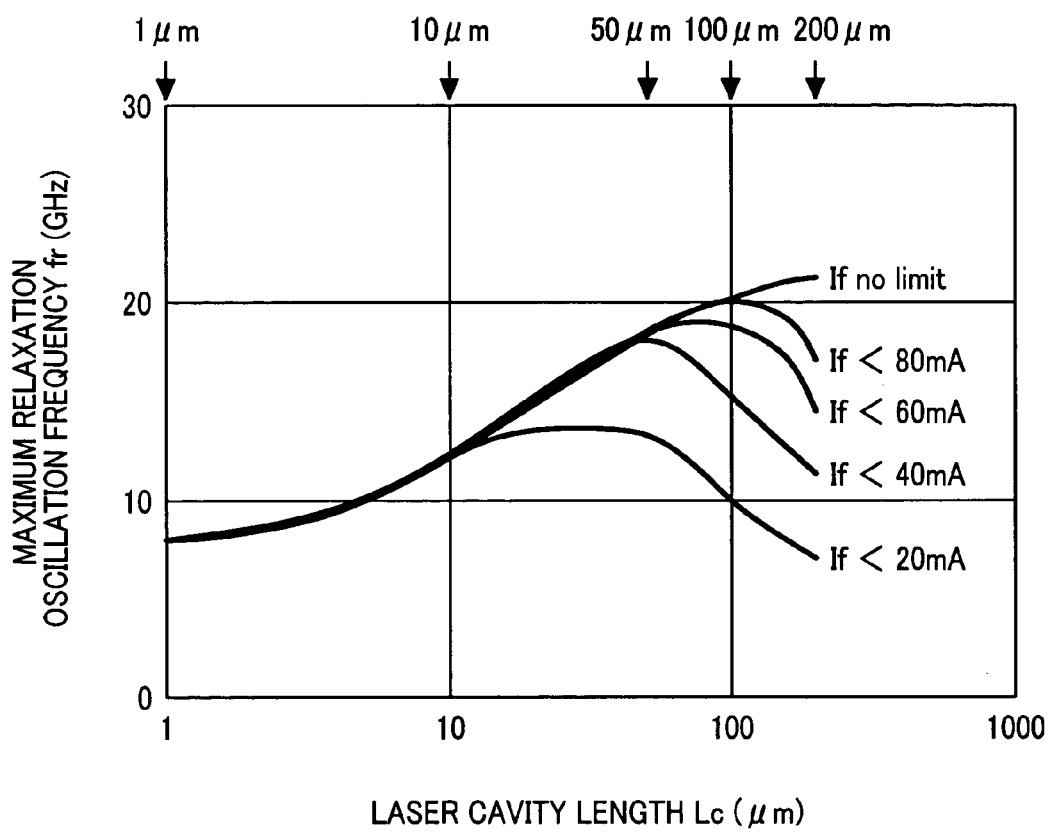
FIG. 2 is a graphical representation showing examples of calculation for dependency of a maximum relaxation oscillation frequency on a laser cavity length.
Figure 3:
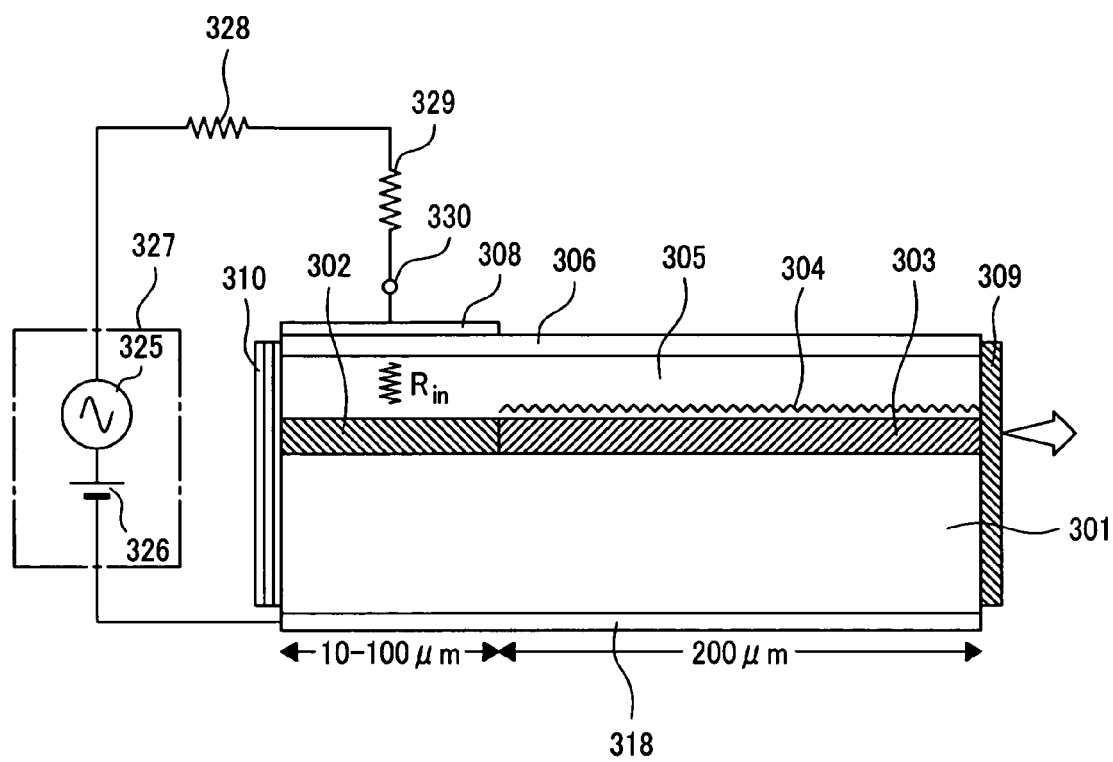
FIG. 3 is a cross-sectional view of a 1300-nm-band InGaAlAs system short cavity laser device according to Embodiment 1 of the present invention.
Figure 4:
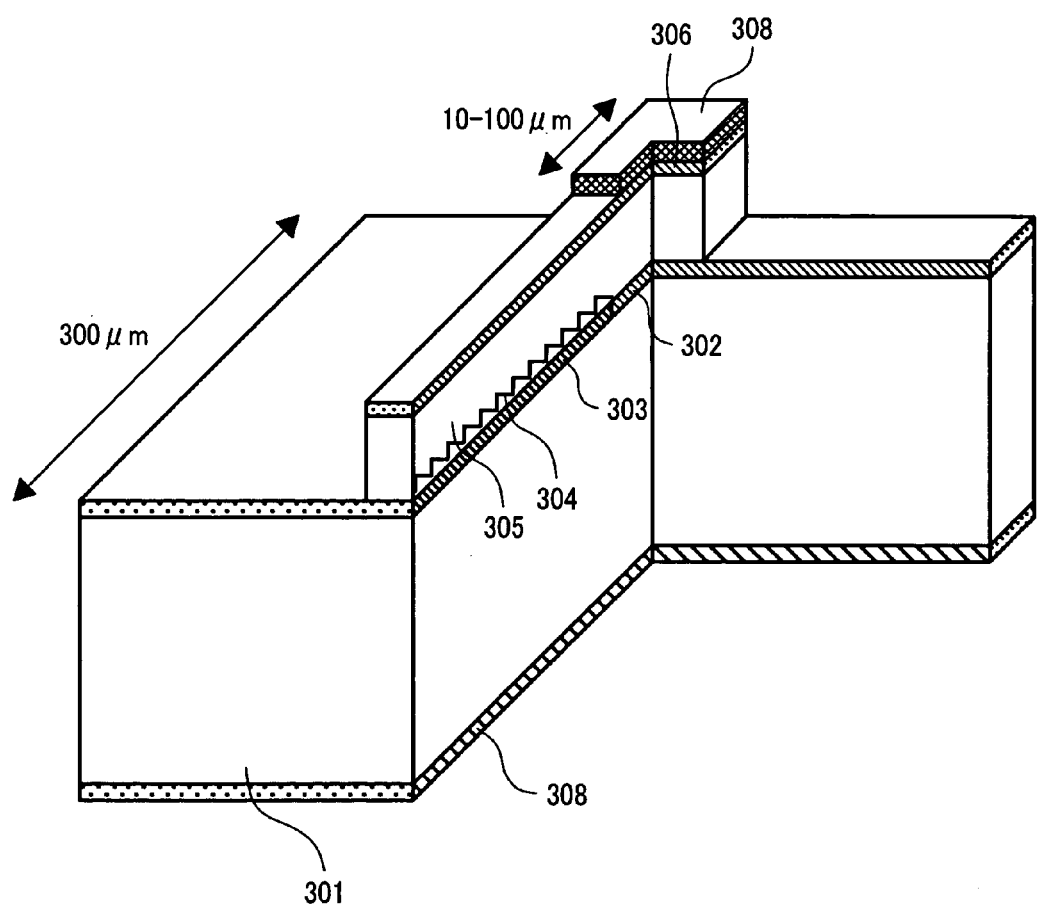
FIG. 4 is a partial perspective cross-sectional view of the laser device shown in FIG. 3.

FIG. 3 is a cross-sectional view of a 1300-nm-band InGaAlAs system short cavity laser device according to Embodiment 1 of the present invention. FIG. 3 also shows an example of a drive circuit for directly modulating this laser. FIG. 4 is a partial cross-sectional perspective view of the laser device shown in FIG. 3.

The laser device is manufactured in accordance with the following procedure. Firstly, a compression strain multiple quantum well (MQW) active layer 302 made of InGaAlAs is grown on an n-type InP substrate 301 by utilizing a metal organic phase epitaxy method. Next, after the InGaAlAs-MQW layer 302 is partially etched away by using an insulator stripe mask, a distributed Bragg reflector (DBR) layer 303 which has a thickness of 300 nm and which is made of bulk INGaAsP (its composition wavelength was 1.10 μm) is integrated in a butt-joint form by utilizing the known method. Subsequently, a uniform-pitch grating 304 having a pitch of about 202 nm is formed in a marking manner on the InGaAsP-DBR layer 303 by utilizing a normal interferomatic exposure method and a wet etching method. Then, a p-type InP cladding layer 305 and a p$^+$-type InGaAs type contact layer 306 are grown over an overall surface of the substrate. After completion of a crystal growth process, the resulting structure is processed into a normal ridge waveguide structure. An electrode is formed only in a laser portion, and a structure of small electrode pad 308 having an area of 60 μm$^2$ is adopted for reduction in capacitance. A back electrode 318 is formed on the other surface of the n-type InP substrate 301.

An active region length as an important parameter is set to the range of 10 to 100 μm. A device length including a DBR region length is set to the range of 150 to 700 μm. A low reflective film 309 having a reflectivity of about 1% and a high reflective film 310 having a reflectivity of about 90% were formed on a front end face and a rear end face of the device, respectively, with the DBR region side taken as the front. At that, in FIG. 4, illustration of the low reflective film 309 is omitted. The completed device is bonded in a junction-up form on a sub-mount by utilizing a die bonding technique. In FIG. 3, reference numeral 327 designates a direct modulation portion, which includes a bias voltage source 326 for directly modulating the device and a high-frequency electrical signal source 325 connected in series with one end of the bias voltage source 326. The other end of the high-frequency electric signal source 325 is connected to a terminal 330 of an electrode pad 308 through high-frequency wiring having a resistor 328 and a matching resistor 329. A resistance value of the matching resistor 329 is selected so that a sum of the resistance value of the matching resistor 329 and a value of an internal resistance $R_{in}$ of the device matches a resistance value of the resistor 328 of the high-frequency wiring. The other end of the bias voltage source 326 is connected to a back electrode 318 and is also grounded. The manufactured device oscillates in a DBR longitudinal mode having a wavelength of about 1305 nm at room temperature.

Figure 5:
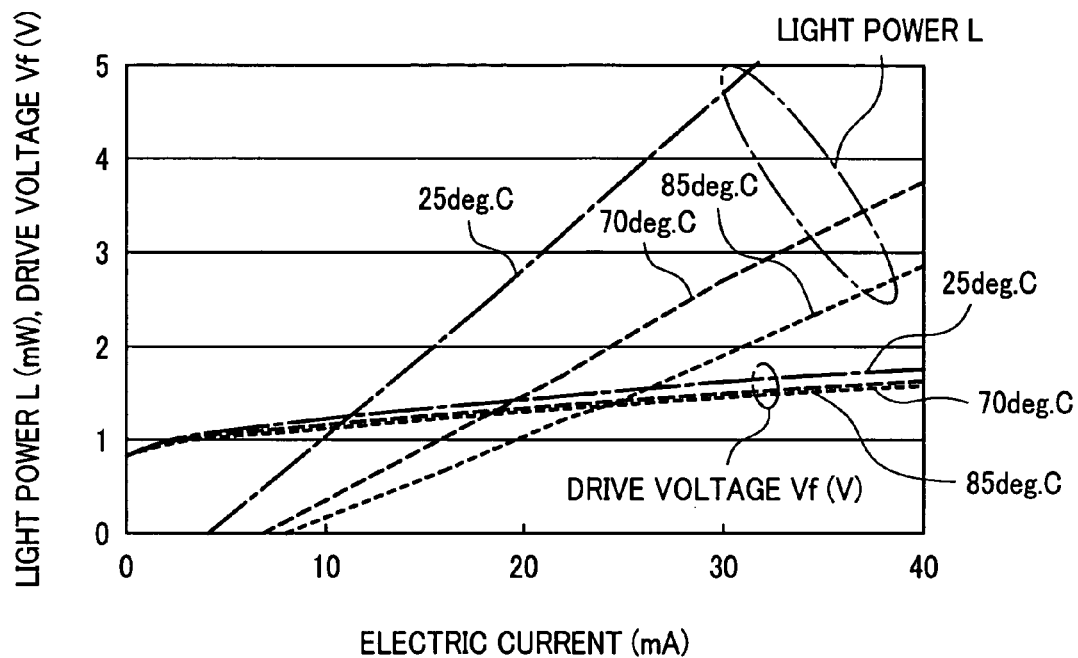
FIG. 5 is a graphical diagram showing an example of dependency of current/light power characteristics on a temperature in the 1300-nm-band InGaAlAs system short cavity laser device according to Embodiment 1 of the present invention.

FIG. 5 is a graphical representation showing an example of dependency of current/light power (I-L) characteristics on a temperature (25, 70 and 85° C.) under a CW condition of the device having the active region length of 75 μm. Oscillation at a low threshold of 10 mA or less is obtained at 85° C. A characteristic temperature T0 was 76 K at temperatures from 25 to 85° C. In addition, in the device according to Embodiment 1 of the present invention, a high chip output of about 2 mW or more was obtained with a current of about 30 mA even at a high temperature of 85° C.

Figure 6:
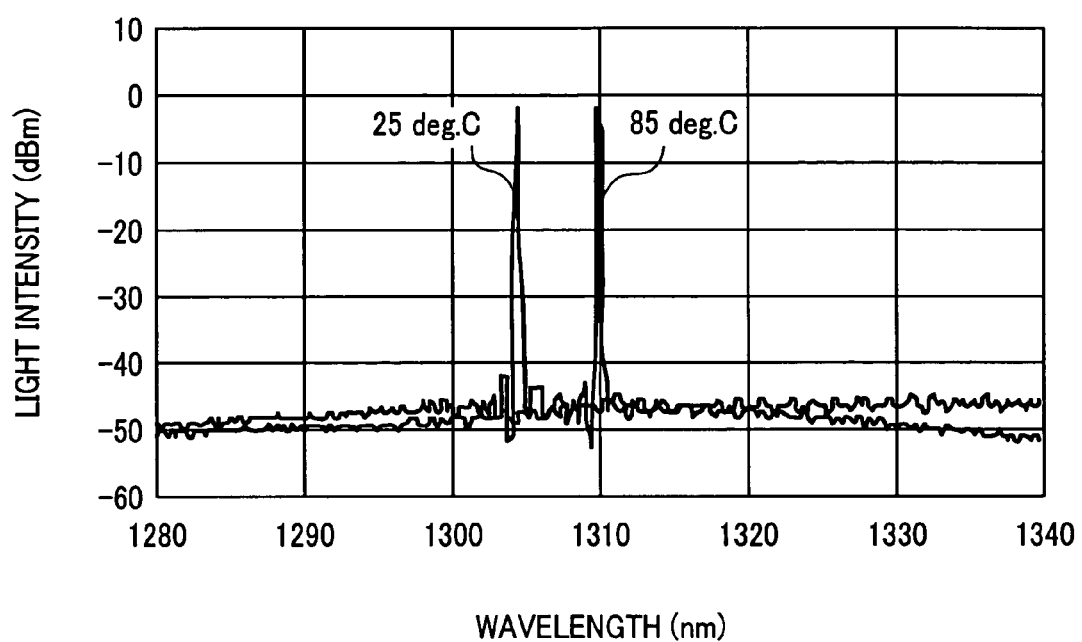
FIG. 6 is a characteristic diagram showing an oscillation spectrum at temperatures of 25° C. and 85° C. in the 1300-nm-band InGaAlAs system short cavity laser device according to Embodiment 1 of the present invention.

FIG. 6 is a characteristic diagram showing an oscillation spectrum at the temperatures of 25° C. and 85° C. A sub-mode suppression ratio of 45 dB or more can be obtained with satisfactory reproducibility since a high threshold gain difference between main- and sub-modes in the short cavity DBR structure is reflected therein. In the 30 or more devices which has an active region length of 10 to 100 μm and which are extracted at random, the sub-mode suppression ratio of 37 dB or more is attained in a yield of about 95%.

Figure 7A:
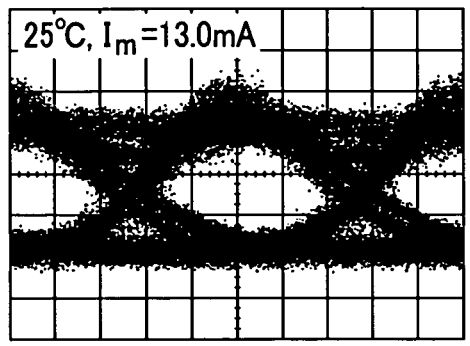
FIGS. 7A, 7B and 7C are waveform charts explaining modulation at a rate of 10 gigabits per second in the 1300-nm-band InGaAlAs system short cavity laser device according to Embodiment 1 of the present invention.
Figure 7B:
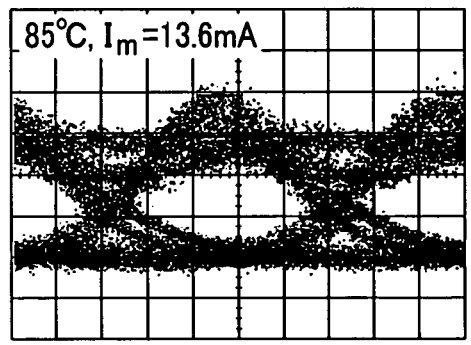
Figure 7C:
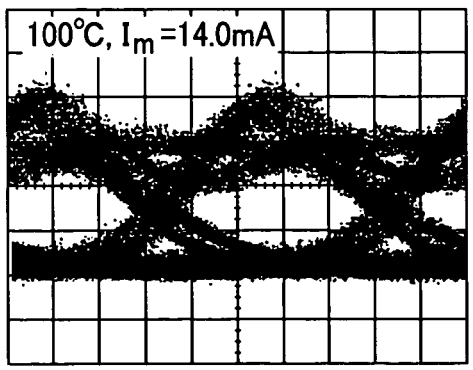

FIGS. 7A, 7B and 7C are waveform charts each illustrating modulation made at a rate of 10 gigabits per second. As shown in FIG. 7A, a dynamic extinction ratio of 6.2 dB is obtained at 25° C. and with a driving current of 13.0 mA. As shown in FIG. 7B, the dynamic extinction ratio of 6.4 dB is obtained at 85° C. and with a driving current of 13.6 mA. Also, as shown in FIG. 7C, the dynamic extinction ratio of 6.8 dB is obtained at 100° C. and with a driving current of 14.0 mA. In reflection of the effect of reducing the driving current by adopting the above-mentioned short cavity structure, a clear eye-opening is observed with a very small amplitude current value of about 14 mA or less. A rise time in the light waveform is about 35 ps, and a fall time therein is also about 35 ps. Also, the dynamic extinction ratio falls within the range of 6.2 to 6.8 dB. Thus, the dynamic extinction ratio specification of the short distance transmission system is fulfilled.

Embodiment 2

Figure 8:
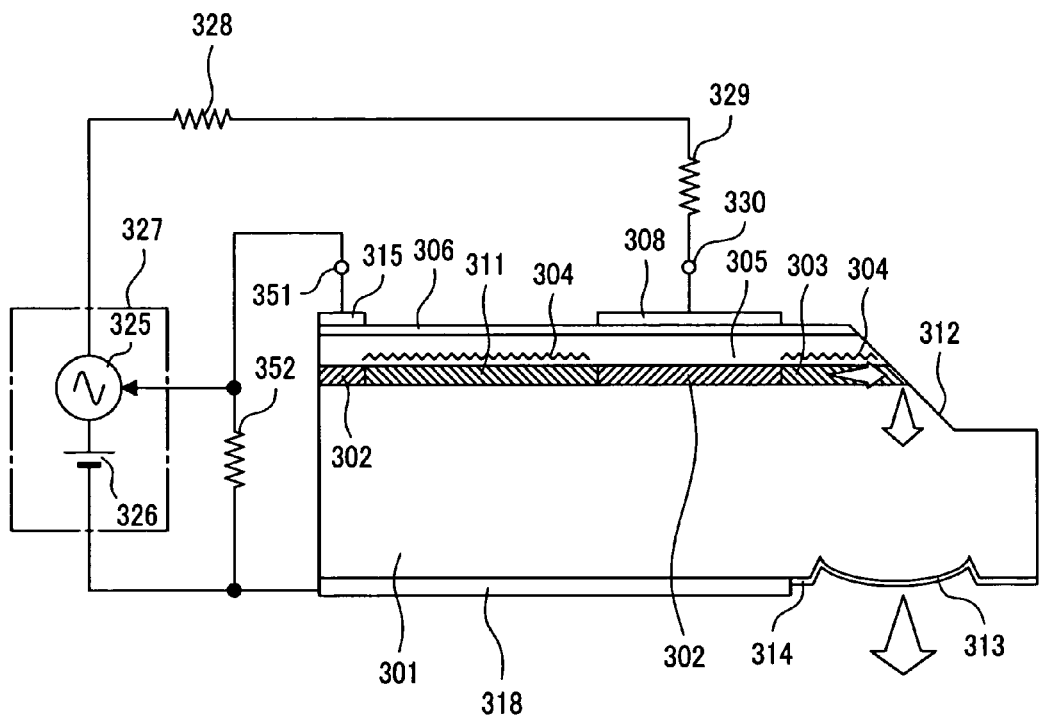
FIG. 8 is a cross-sectional view of a 1300-nm-band DBR vertical cavity surface emitting laser having an InGaAlAs system short cavity according to Embodiment 2 of the present invention.

FIG. 8 illustrates a device structure of a 1300-nm-band vertical cavity surface emission type InGaAlAs system short cavity laser according to Embodiment 2 of the present invention. FIG. 8 also illustrates an example of a drive circuit for directly modulating this laser. A basic structure of this laser is basically the same as that of the laser described in Embodiment 1 except for the following points. That is to say, the high reflective film 310 formed in the rear of the laser is replaced with a rear DBR layer 311, the compression strain MQW active layer 302 made of InGaAlAs is left in the rear of the rear DBR layer 311 in order to monitor an output from the device, and an output monitoring electrode 315 is formed at a position corresponding thereto. The device length including the DBR region length is set to the range of 150 to 700 μm similarly to the case of Embodiment 1. In Embodiment 2, in order to emit a laser oscillation beam downward of the substrate 301, a 45°-mirror 312 is formed at the end of the front DBR layer 303 by utilizing the known method. As a result, the laser oscillation beam which has passed through the front DBR layer 303 passes through the transparent InP substrate 301 and is emitted through the rear thereof. In the structure of Embodiment 2, the reflectivity of the rear DBR layer 311 is made sufficiently large, and the laser oscillation beam is totally reflected to the substrate side by the 45°-mirror. Thus, all the portions constituting the laser cavity are formed during the semiconductor wafer process.

Consequently, neither of the reflective film and the reflective structure is required at the laser end face. This point is essentially different from the conventional vertical cavity surface emitting laser using the 45°-mirror which is typically described in non-patent documents 6 and 7, and is an important point for the practical use. At that, a known Fresnel lens 313 is formed in the emission portion of the rear of the substrate 301, and a non-reflective coating 314 is formed on the known Fresnel lens 313.

Figure 9:
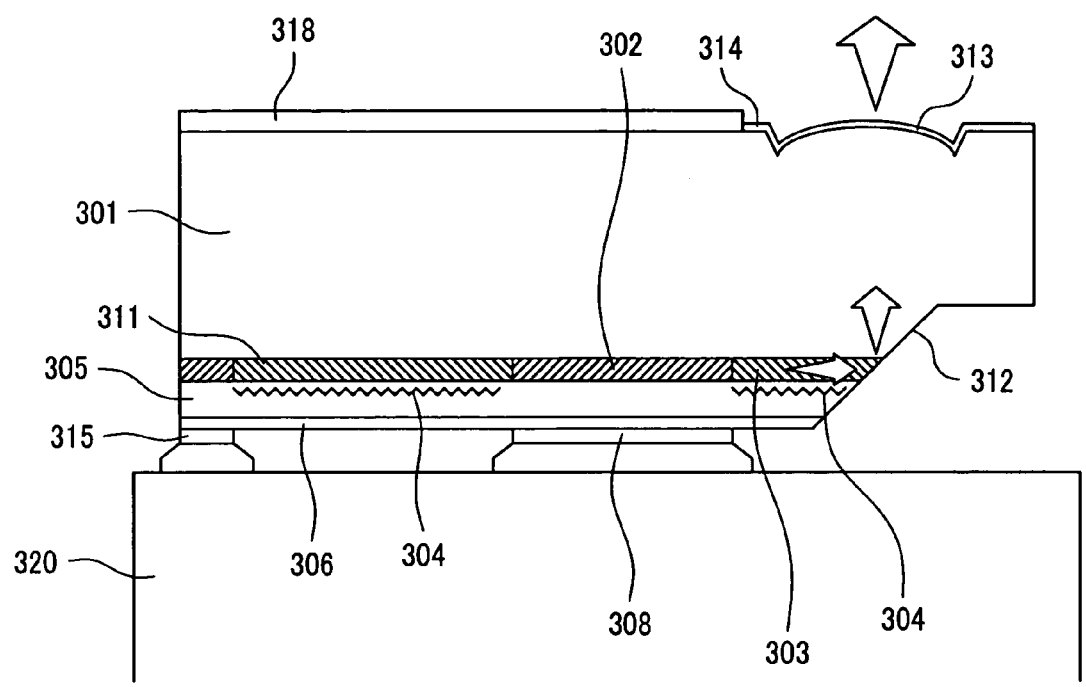
FIG. 9 is a cross-sectional view showing a structure in which the 1300-nm-band DBR vertical cavity surface emitting laser having the InGaAlAs system short cavity according to Embodiment 2 of the present invention is mounted in a junction-down form.

As shown in FIG. 9, the completed device is disposed so that the active layer 302 of the laser beam became near an upper surface of the sub-mount 320, and is bonded in the so-called junction-down form on the sub-mount 320 by the die bonding technique. The relationship between the direct modulation portion 327 and the device is basically the same as that of Embodiment 1. However, a voltage developed across a resistor 352 connected between the terminal 351 of the output monitoring electrode 315 and the back electrode 318 is fed back to the high-frequency electrical signal source 325 in order to stabilize the light emitting operation of the device.

The basic characteristics of the manufactured device such as the threshold currents and the light emission efficiencies at room temperature and at high temperatures were substantially the same as those of the device according to Embodiment 1 of the present invention. On the other hand, the heat radiation property when a current was caused to flow through the laser was enhanced due to adoption of the junction-down mounting form. As a result, saturated light power was improved by about 50%. This enhanced the maximum relaxation oscillation frequency by about 20%. In addition, an angle of emission through the rear of the substrate 301 was reduced by about 15° due to provision of the Fresnel lends 312. As a result, similarly to the conventional vertical cavity surface emitting laser, the fiber optical coupling of about −3 dB was realized without using any of the optical lenses. In addition, since in this structure, all the portions are formed during the wafer process of the laser similarly to the conventional vertical cavity surface emitting laser, unlike the edge emitting laser, neither of the end face cleavage structure and the end face coating structure becomes necessary. For this reason, this structure can be said to be one excellent in economical efficiency since an inspection test in a wafer stage becomes possible.

According to Embodiment 2 of the present invention, the laser light source is realized which has both the high output property of the short cavity edge emitting laser, and the economical efficiency of the vertical cavity surface emitting laser, and thus which is suitable for the power saving and inexpensive optical module.

Embodiment 3

Figure 10:
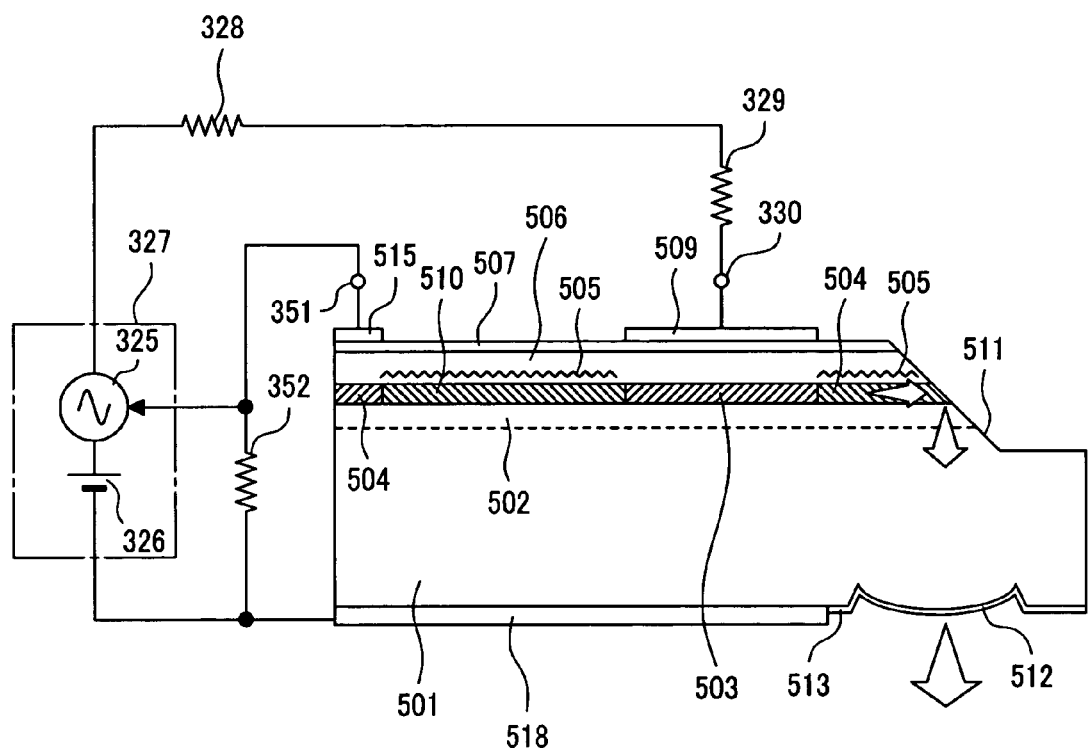
FIG. 10 is a cross-sectional view of a 1300-nm-band DBR vertical cavity surface emitting laser having a GaInNAs system short cavity according to Embodiment 3 of the present invention.

FIG. 10 is a cross-sectional view of a 1300-nm-band vertical cavity surface emitting laser having a GaInNAs system short cavity DBR structure according to Embodiment 3 of the present invention.

The laser device is manufactured in accordance with the following procedure. Firstly, an n-type InGaP buffer layer 502, and a GaInNAs-MQW active layer 503 having an emission wavelength of 1300 nm are grown in this order on an n-type GaAs substrate 501 by utilizing a molecular beam epitaxy method. Next, after the GaInNAs-MQW layer 503 has been partially etched away by using an insulator stripe mask, a distributed Bragg reflective (DBR) layer 504 which has a thickness of 300 nm and which is made of bulk GaAs, and a back distributed Bragg reflective (DBR) layer 510 made of GaAs are integrated in a butt-joint form by utilizing the known method. Subsequently, a uniform-pitch grating 505 having a pitch of about 199 nm is formed in a marking manner on the GaAs-DBR layer 504 and the GaAs-back distributed Bragg reflective (DBR) layer 510 by utilizing the normal interferomatic exposure method and the wet etching method. Then, a p-type InGaP cladding layer 506 and a p$^+$-type GaAs contact layer 507 are grown over an overall surface of the substrate. After completion of the crystal growth process, the resulting structure is processed into the normal ridge waveguide structure. While the distributed Bragg reflective (DBR) layer 504 is made of GaAs in Embodiment 3, the DBR layer 504 may be made of InGaAsP or InGaP instead. An electrode is formed only in the laser portion, and a small electrode pad 509 structure having an area of 60 μm$^2$ is adopted for reduction in capacitance. An active region length as an important parameter is set to the range of 10 to 100 μm. A device length including a DBR region length is set to the range of 150 to 700 μm similarly to Embodiment 1. A 45°-mirror 511 is formed on the end of the DBR region similarly to Embodiment 2 by utilizing the known method. After the completed device has been bonded in a junction-down form on a sub-mount by utilizing the die bonding technique, it is connected together with a terminal resistor of 50Ω on a stem through wiring by utilizing a high-frequency connection method. At that, in FIG. 10, reference numeral 512 designates a Fresnel lens, reference numeral 513 designates a non-reflective coating, and reference numeral 514 designates an output monitor. Incidentally, a back electrode 518 is provided on the other surface of the n-type GaAs substrate 501. The relationship between the direct modulation portion 327 and the device is basically the same as that of Embodiment 1. However, the voltage developed across the resistor 352 connected between the terminal 351 of the output monitoring electrode 315 and the back electrode 518 is fed back to the high-frequency electrical signal source 325 in order to stabilize the light emitting operation of the device.

The manufactured device operated with the characteristics equal to or higher than those of Embodiment 1, and the modulation at a rate of 10 gigabits per second was realized under the condition of the low amplitude current of about 10 mA or less.

Embodiment 4

Figure 11:
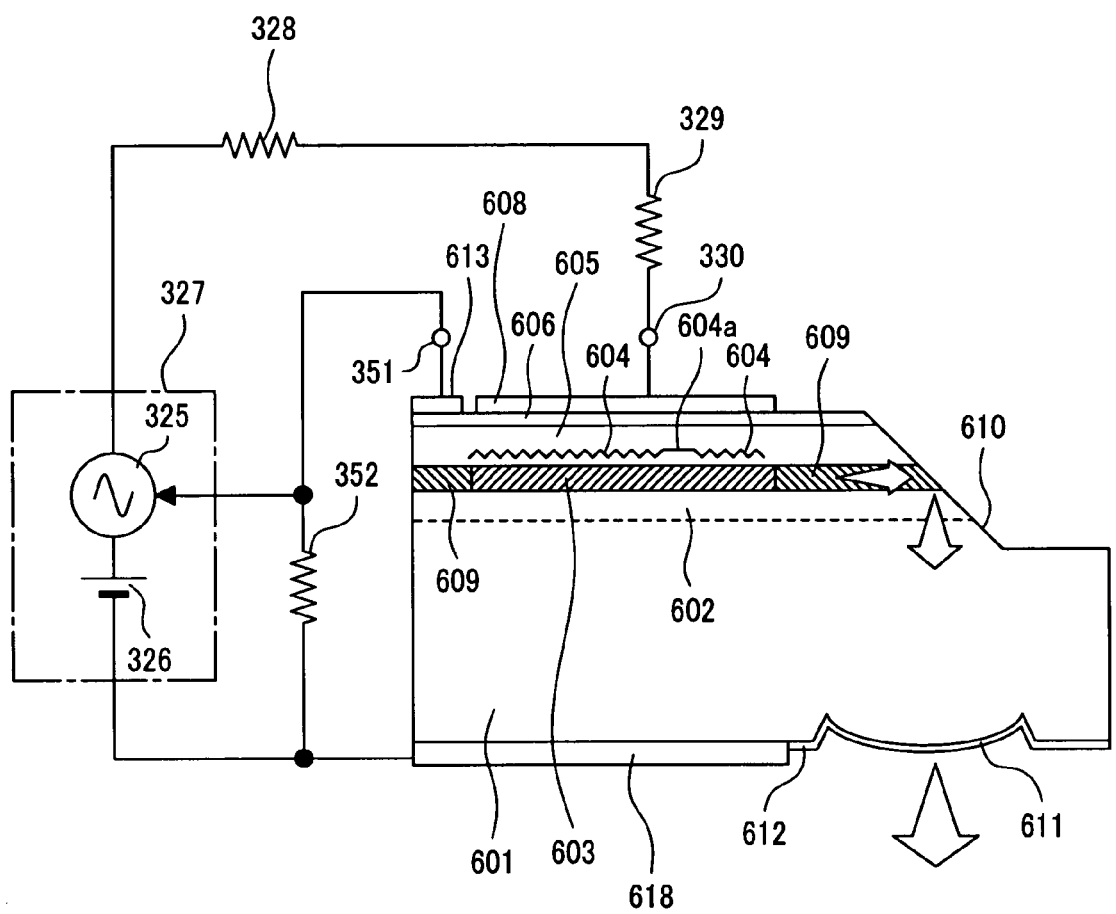
FIG. 11 is a cross-sectional view of a 1300-nm-band DBR vertical cavity surface emitting laser having a GaInNAs system short cavity according to Embodiment 4 of the present invention.

FIG. 11 is a cross sectional view of a 1300-nm-band vertical cavity surface emitting laser having a GaInNAs system short cavity distributed feedback (DFB) structure according to Embodiment 4 of the present invention. In the figure, reference numeral 601 designates an n-type GaAs substrate; reference numeral 602 designates an n-type InGaP buffer layer; reference numeral 603 designates a GaInNAs-MQW active layer; reference numeral 604 designates a diffraction grating; reference numeral 604a designates a λ/4 phase shift structure; reference numeral 605 designates a p-type InGaP cladding layer; reference numeral 606 designates a p⁺-type GaAs contact layer; reference numeral 608 designates a small electrode pad; reference numeral 609, a GaAs waveguide; reference numeral 610, a 45° C.-mirror; reference numeral 611, a Fresnel lens; reference numeral 612, a non-reflective coating; and 613, an output monitor. At that, a back electrode 618 is provided on the other surface of the n-type GaAs substrate 601. The relationship between the direct modulation portion 327 and the device is basically the same as that of Embodiment 1. However, the voltage developed across the resistor 352 connected between the terminal 351 of the output monitoring electrode 315 and the back electrode 618 is fed back to the high-frequency electrical signal source 325 in order to stabilize the light emitting operation of the device.

The basic method of manufacturing the device is the same as that in Embodiment 3 except that the diffraction grating 604 is formed on the GaInNAs-MQW active layer 603 having an emission wavelength of 1300 nm. A device length including a DFB region length was set to a range of 150 to 700 μm similarly to Embodiment 1.

The manufactured device operated with the characteristics equal to or higher than those of Embodiment 1, and the modulation at a rate of 10 gigabits per second was realized under the condition of the low amplitude current of about 10 mA or less.

The examples of mainly applying the present invention to the semiconductor laser for optical communication applications have been described based on Embodiments 1 to 4 so far. However, it should be noted that the application range of the present invention is not limited to the semiconductor laser for the optical communication applications, and thus the present invention can also be applied to an arbitrary waveguide type vertical cavity surface emitting semiconductor laser which realizes suitable light power with low power consumption.

The present invention can be realized in the form of the following constitutions in correspondence to Embodiments 1 to 4 described above in addition to the constitutions described in claims.

1. A distributed Bragg reflector laser including a predetermined semiconductor substrate, and a multilayer structure formed on the predetermined semiconductor substrate, the multilayer structure including at least an active layer region for emitting a laser beam and a distributed Bragg reflector layer, a length of the active layer region falling within a range of 10 to 100 μm, a laser beam signal being generated in accordance with ON/OFF of current injection to the active layer region, in which respective distributed Bragg reflector layers are disposed before and after the active region, and a laser emission end face has an angled mirror for changing a direction of emission of light power to a direction from the active layer region to the semiconductor substrate, wherein the semiconductor substrate is a GaAs substrate, and the active layer material contains Ga, In, N and As.

2. A distributed Bragg reflector laser according to paragraph 1, wherein a material of which a diffraction grating of the distributed Bragg reflector layer is made contains any one of InGaAsP, GaAs and InGaP.

What is claimed is:

1. A distributed Bragg reflector type directly modulated surface emitting laser comprising:

an active layer region whose length falls within a range of 10 to 100 μm provided on a semiconductor substrate; and a distributed Bragg reflector (DBR) layer connected to at least one side of the active layer region, wherein the active layer region is a current injection region and the distributed Bragg reflector (DBR) layer is a non-current injection region;

wherein a laser cavity is comprised of the active layer region being an optical waveguide and the distributed Bragg reflector (DBR) layer being an optical waveguide;

wherein a laser beam signal is generated by injecting a current into the active layer region;

wherein the laser is a single lateral mode directly modulated laser; and wherein a laser cavity includes a laser emission end portion including a 45° angled mirror adjacent the DBR layer, on an opposite side of the DBR layer from the active region for changing a direction of emission of light power from an extending direction of the laser cavity to a direction toward one of surfaces of the semiconductor substrate, and further include a back side end portion formed by a cleavage method, said back side end portion being formed adjacent the active layer on an opposite side of the active layer from the DBR layer.

2. The distributed Bragg reflector type directly modulated laser according to claim 1, wherein said active layer region and said distributed Bragg reflector layer are connected by a butt-joint connection.

3. The distributed Bragg reflector type directly modulated laser according to claim 1, wherein an optical device length along which a direction of a cavity of said distributed Bragg reflector laser falls within a range of 150 to 700 μm.

4. The distributed Bragg reflector type directly modulated laser according to claim 1, wherein an operation wavelength of said distributed Bragg reflector laser falls within a range of 1.2 to 1.4 μm.

5. The distributed Bragg reflector type directly modulated laser according to claim 1, wherein said predetermined substrate comprises an InP substrate, and a material for said active layer region is comprised of In, Ga, Al and As.

6. The distributed Bragg reflector type directly modulated laser according to claim 5, wherein a material of which a diffraction grating of said distributed Bragg reflector layer is made comprises InGaAsP.

7. The distributed Bragg reflector type directly modulated laser according to claim 1, wherein a pair of distributed Bragg reflector (DBR) layers are connected to opposite sides of the active layer region to form the laser cavity, wherein both of the pair of distributed Bragg reflector (DBR) layers are optical waveguides.

8. The distributed Bragg reflector type directly modulated surface emitting laser according to claim 1, wherein a high reflective film is formed on said back side end portion of said laser cavity.

9. The distributed Bragg reflector type directly modulated surface emitting laser according to claim 1, wherein the laser is a vertical cavity laser.

10. The distributed Bragg reflector type directly modulated surface emitting laser according to claim 2, wherein the laser is a vertical cavity laser.

11. The distributed Bragg reflector type directly modulated surface emitting laser according to claim 1, wherein the laser is a vertical cavity laser.

12. The distributed Bragg reflector type directly modulated surface emitting laser according to claim 3, wherein the laser is a vertical cavity laser.

13. The distributed Bragg reflector type directly modulated surface emitting laser according to claim 4, wherein the laser is a vertical cavity laser.

14. The distributed Bragg reflector type directly modulated surface emitting laser according to claim 5, wherein the laser is a vertical cavity laser.

15. The distributed Bragg reflector type directly modulated surface emitting laser according to claim 6, wherein the laser is a vertical cavity laser.

16. The distributed Bragg reflector type directly modulated surface emitting laser according to claim 7, wherein the laser is a vertical cavity laser.

17. The distributed Bragg reflector type directly modulated surface emitting laser according to claim 8, wherein the laser is a vertical cavity laser.

* * * * *